(12) United States Patent
Hoffmann

(10) Patent No.: US 11,990,741 B2
(45) Date of Patent: May 21, 2024

(54) DEVICE FOR COOLING A BUS BAR

(71) Applicant: Siemens Aktiengesellschaft, Munich (DE)

(72) Inventor: Ingolf Hoffmann, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 370 days.

(21) Appl. No.: 17/297,286

(22) PCT Filed: Oct. 30, 2019

(86) PCT No.: PCT/EP2019/079586
§ 371 (c)(1),
(2) Date: May 26, 2021

(87) PCT Pub. No.: WO2020/108905
PCT Pub. Date: Jun. 4, 2020

(65) Prior Publication Data
US 2022/0037871 A1  Feb. 3, 2022

(30) Foreign Application Priority Data

Nov. 27, 2018  (EP) ..................................... 18208453

(51) Int. Cl.
*H02G 15/10* (2006.01)
*H02G 5/10* (2006.01)
*H05K 7/20* (2006.01)
*H02B 13/00* (2006.01)

(52) U.S. Cl.
CPC ........... *H02G 5/10* (2013.01); *H05K 7/20454* (2013.01); *H05K 7/209* (2013.01); *H02B 13/00* (2013.01)

(58) Field of Classification Search
CPC ....................................................... H02G 15/10
USPC ................................................. 174/16.2, 16.3
See application file for complete search history.

(56) References Cited

U.S. PATENT DOCUMENTS

| | | | | |
|---|---|---|---|---|
| 5,164,624 A | * | 11/1992 | Desai ..................... | H01L 25/112 361/717 |
| 6,918,438 B2 | * | 7/2005 | Ellsworth, Jr. ..... | H01L 23/3737 165/905 |
| 10,178,813 B2 | * | 1/2019 | Boteler ................ | H05K 7/2089 |
| 10,283,945 B2 | * | 5/2019 | Fritz ........................ | H02G 3/03 |

(Continued)

FOREIGN PATENT DOCUMENTS

| | | |
|---|---|---|
| CN | 2843009 Y | 11/2006 |
| CN | 101776941 A | 7/2010 |

(Continued)

OTHER PUBLICATIONS

PCT International Search Report and Written Opinion of International Searching Authority dated Jan. 30, 2020 corresponding to PCT International Application No. PCT/EP2019/079586 filed Oct. 30, 2019.

*Primary Examiner* — Chau N Nguyen
(74) *Attorney, Agent, or Firm* — Henry M. Feiereisen LLC

(57) ABSTRACT

A device for cooling a bus bar includes a heat absorption element, a heat transportation system and a heat output element. The heat absorption element and heat output element rest essentially in a form-fit manner on respective heat sources or heat sinks, with additional contact pressure being applied with the heat absorption element and heat output element by compression springs or contact elements.

7 Claims, 4 Drawing Sheets

(56) References Cited

U.S. PATENT DOCUMENTS

| | | | |
|---|---|---|---|
| 2007/0030656 | A1 | 2/2007 | Ross et al. |
| 2010/0172088 | A1 | 7/2010 | Lian et al. |
| 2011/0242760 | A1 | 10/2011 | Bott et al. |
| 2012/0113569 | A1 | 5/2012 | Peralta et al. |
| 2013/0043071 | A1* | 2/2013 | Subramaniam .......... H02G 5/10 |
| | | | 174/70 B |
| 2015/0124381 | A1 | 5/2015 | Wu |

FOREIGN PATENT DOCUMENTS

| | | |
|---|---|---|
| CN | 202254997 U | 5/2012 |
| CN | 205726824 U | 11/2016 |
| DE | 4004457 A1 | 8/1991 |
| DE | 19603224 A1 | 7/1997 |
| DE | 10 2007 003 875 A1 | 8/2008 |
| EP | 1995840 A1 | 11/2008 |
| EP | 2 356 894 A1 | 8/2011 |
| JP | H09331177 A | 12/1997 |
| JP | 2000022366 A | 1/2000 |
| TW | 200911099 A | 3/2009 |
| WO | WO 2014132399 A1 | 9/2014 |
| WO | WO 2017103844 A1 | 6/2017 |

* cited by examiner

DEVICE FOR COOLING A BUS BAR

CROSS-REFERENCES TO RELATED APPLICATIONS

This application is the U.S. National Stage of International Application No. PCT/EP2019/079586, filed Oct. 30, 2019, which designated the United States and has been published as International Publication No. WO 2020/108905 A1 and which claims the priority of European Patent Application, Serial No. 18208453.3, filed Nov. 27, 2018, pursuant to 35 U.S.C. 119(a)-(d).

BACKGROUND OF THE INVENTION

The invention relates to a device for cooling a bus bar.

Bus bars from, to and in power electronic apparatuses, in low and medium voltage control cabinets and distribution systems have self-heating, which, depending on the dimensioning of the bus bar and the current density available in the bus bar, leads to a rise in temperature. Therefore the limit for bus bars made from copper is approx. 2.2 $A/mm^2$ and with bus bars made from aluminum approx. 1.5 $A/mm^2$, for instance. If these bus bars come into electrical contact with semiconductor modules of a converter of a drive, for instance, a heat flow can materialize from the bus bar into the semiconductor module. This possibly additional heat input into the semiconductor module can significantly reduce its service life and accordingly result in failures of the semiconductor module and thus of the converters and their drive.

Furthermore, in addition to the heat developing in the power electronic apparatuses, the heat losses from the bus bars must be discharged from the control cabinets, for instance. These power electronic apparatuses are semiconductor modules, capacitors or throttles, for instance.

With liquid-cooled power electronic apparatuses, which are provided in higher protection control cabinets because of their design, the heat Is only discharged with comparatively high effort.

The heat losses of the bus bars can also be discharged passively as a result of surface enlargement, for instance through cooling plates by means of self-convection.

Furthermore, the heat losses of the bus bars can also be discharged actively as a result of surface enlargement, by means of cooling sheets and/or accelerated convection by means of additional fans.

The disadvantage with the generally presented solutions is that in addition to the heat accumulating in the power electronic apparatuses, the quantity of heat losses of the bus bars must inter alfa be discharged from the air. In liquid-cooled power electronic apparatuses, this results in particular in disadvantages, since the quantity of heat from the bus bars has to be discharged via air convection, in order not to further heat up the power electronic apparatuses.

On this basis the object underlying the invention is to provide a device for cooling a bus bar, which avoids the afore-cited disadvantages.

SUMMARY OF THE INVENTION

The solution to the set object is achieved by a device for cooling a bus bar with:
at least one heat absorption element,
at least one heat transportation system,
at least one heat output element.

The set object is also achieved by using this device to cool at least one bus bar in compact electrical switching systems with bus bar arrangements, in particular control cabinets of converters, low voltage switching systems and medium voltage switching systems.

In accordance with the invention, a heat transportation system is now provided, which has a heat absorption element, a heat transportation system and a heat output element, in order thus to connect the heat source, in other words the bus bar, to a heat sink, for instance a heat exchanger or another cooler environment, in a thermally-conducting manner.

On account of the comparatively good heat conductivity, here the heat absorption element and also heat output element are made of copper. Similarly, the heat transportation system can be made of solid copper or as a heat pipe.

The device for cooling the bus bar can be designed to be scalable in terms of number and thus adjusted in a modular manner to the required heat transportation power.

With solid copper, welding and soldering connections are suitable as thermally-conducting connecting methods between the heat absorption element and heat output element and heat transportation system.

In order to obtain an additional contact pressure of the heat absorption elements and/or heat output elements on their additional heat sinks and heat sources, contact elements which are embodied as compression springs or disk springs are provided on and/or between the heat absorption elements and heat output elements.

With a mutual support, it is also ensured as a result that the heat absorption elements and the heat output elements are always aligned in parallel.

Since the bus bar is non-isolated during normal operation, the heat absorption element is generally at ground potential, however, an electrical insulation between the heat absorption element and the bus bar is therefore required. To this end, the heat absorption element is encased with an insulating layer. This can be implemented as a ceramic thermally-conducting film or phase-change film, which contributes to the electrical isolation and a simultaneous heat flow.

To ensure that a corresponding heat flow is also ensured during the heat output in addition to a large-area contacting, the heat output element with the heat sink can likewise be provided with a thermally-conducting film of a phase change film or a thermally-conducting paste. Advantageously, the bus bar is cooled comparatively well by means of the now large-area contact resting elements, such as the heat absorption element, heat output element and adequate heat transportation.

The heat input into the power electronic apparatuses is thus avoided.

The heat absorption elements and heat output elements are preferably embodied to be flat, in order to adjust as well as possible to the surface of the generally flat bus bar. With other cross-.sectional shapes of the bus bar, in other words square, trapezoid, oval etc., the heat absorption elements and heat output elements are to be embodied to be accordingly adjusted. More minimal adjustments to the surface structures of bus bars and/or heat absorption element or heat output element are also carried out by way of the thermal conducting films and/or thermal conducting pastes.

Similarly, in accordance with the invention, these heat absorption elements and heat output elements can also allow for compensation with thermal and/or mechanical expansions of the bus bars, without losing the thermally-conducting contact. This is ensured inter alia by the contact elements.

The device now enables a cooling of the bus bars, without significant heat output to the environment, in particular in a control cabinet. Furthermore, the cooling power can be scaled by varying the number and/or type of the heat absorption elements, heat output elements and/or heat transportation elements. The heat output elements are preferably arranged outside of a control cabinet.

Furthermore, this device is also particularly suited to use in liquid-cooled power electronic apparatuses, whereby assembly of this device in high protection control cabinets is possible without additional outlay.

BRIEF DESCRIPTION OF THE DRAWING

The invention and further advantageous embodiments thereof will now be described in greater detail by reference to basic representations of exemplary embodiments, in the figures.

DETAILED DESCRIPTION OF PREFERRED EMBODIMENTS

Figure 1:
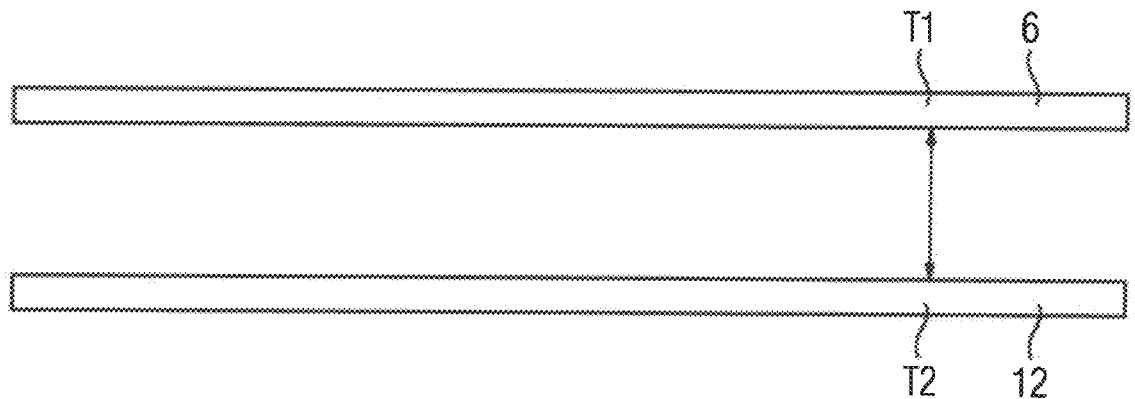
FIG. 1 shows the principle of heat source heat sink.

FIG. 1 shows a basic representation of a heat source with a temperature T1 and a heat sink 12 with a temperature T2. Here T1 is larger than T2. Here the heat is to be guided out of the heat source to the heat sink 12.

Figure 2:
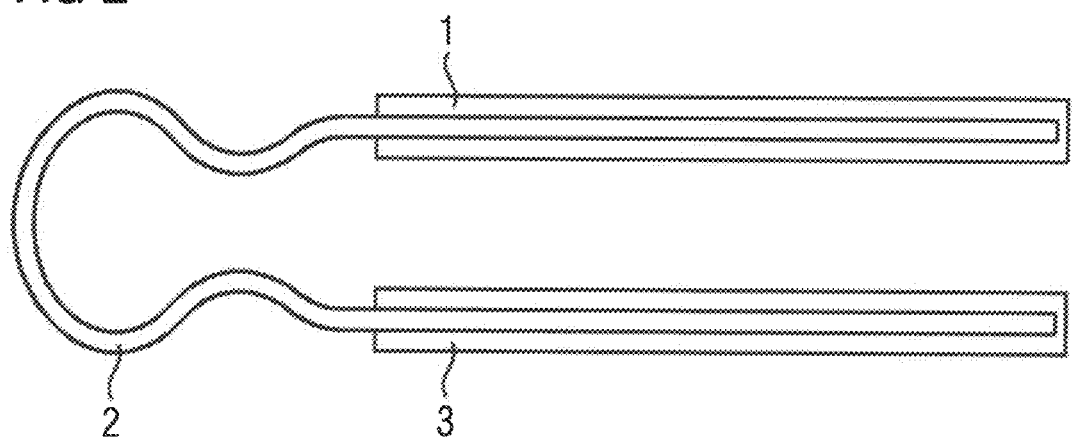
FIGS. 2, 3 show different views of the heat output or absorption elements.
Figure 3:
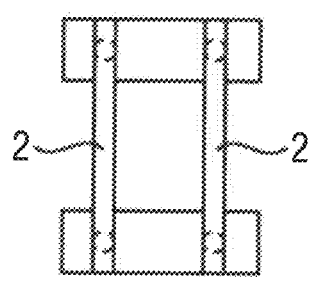

This takes place, as shown in FIG. 2 and FIG. 3 in different perspectives, by a heat absorption element 1 being connected in a thermally conducting manner to a heat output element 3 by way of a heat transportation system 2, Here a number of heat absorption elements 1, heat output element 3 and also a number of heat transportation systems 2 can be arranged in a scalable manner on a bus bar 6.

Figure 4:
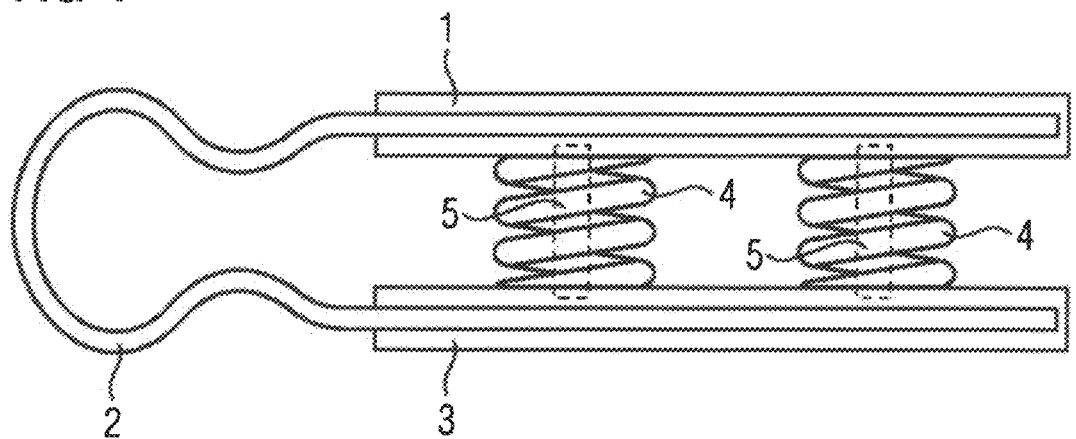
FIGS. 4, 5 show these elements with compression springs.
Figure 5:
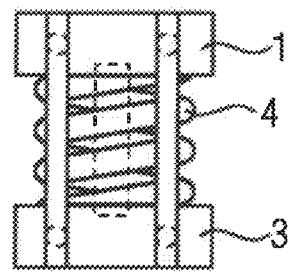

FIG. 4 shows the arrangement according to FIG. 2 and FIG. 3 with a compression spring 4 between the heat absorption element 1 and heat output element 3, in order to obtain an additional contact pressure on certain heat sources and heat sinks, in order to improve the heat transfer in each case. Here the compression springs 4 are guided through a guiding pin 5. This arrangement permits a compensation with thermal and/or mechanical expansions of the bus bar 6, without negatively affecting the thermally-conducting contact.

Figure 6:
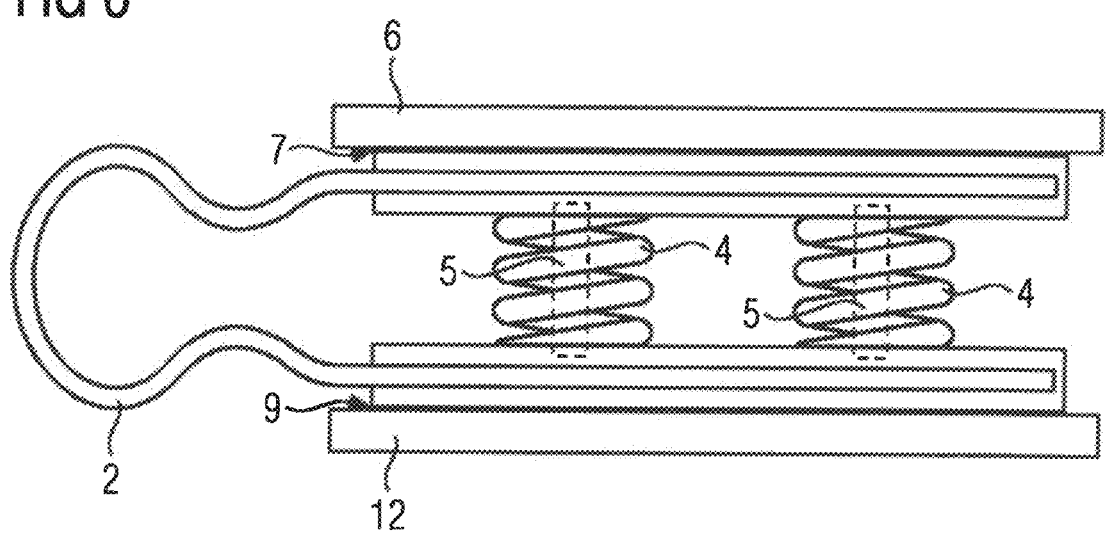
FIGS. 6, 7 show the device on the bus bar and heat sink.
Figure 7:
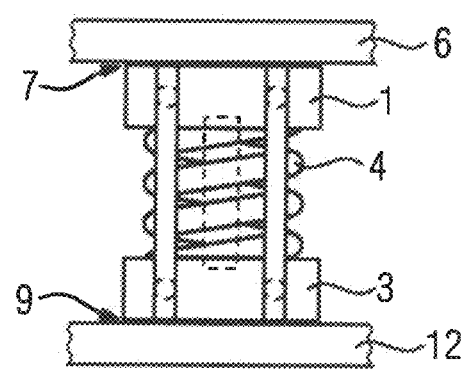

FIG. 6, FIG. 7 show the arrangement with compression springs 4 now in use on a bus bar 6, which is arranged with an insulation layer 7 at a distance from the heat absorption element 1. A heat-conducting paste 9 is provided between the bus bar 6 and heat absorption element 1 and/or between the heat absorption element 3 and heat sink 12, for instance, in order to output the heat from the bus bar 6 via the insulation layer 7 to the heat absorption element 1 or from the heat output element 3 to the heat sink 12. The heat sink 12 is embodied as a heat exchanger, for instance, which is arranged outside of a control cabinet.

Figure 8:
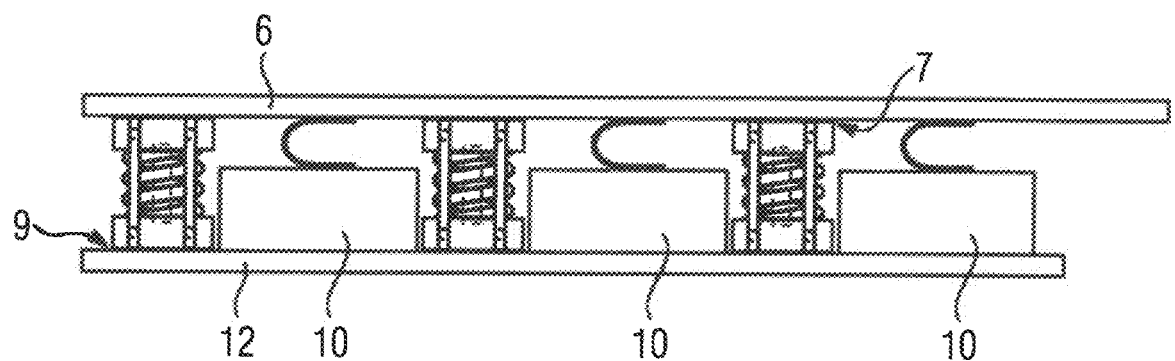
FIGS. 8, 9 show the device for cooling within a power electronic apparatus.

FIG. 8 shows arrangements of this type within a control cabinet, for instance, wherein a number of semiconductor modules 10 are arranged in electrical contact with the bus bar 6, and wherein additionally the bus bar 6 is additionally cooled by the afore-described arrangement.

The semiconductor modules 10 are advantageously arranged likewise in a heat-conducting manner on a heat sink 12 by taking the insulation requirements into account.

Figure 9:
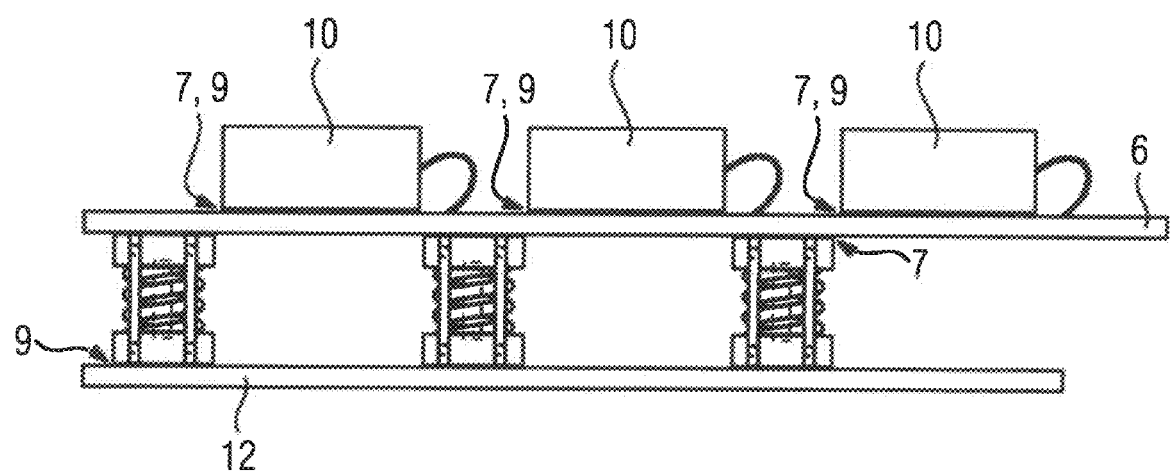

The semiconductor modules 10 can likewise be arranged in a direct thermally-conducting manner on the bus bar 6 according to FIG. 9 by taking the insulation requirements into account.

In accordance with the invention, a number of heat absorption elements 1 can also be guided on a heat output element 3. For instance, a three-phase bus bar arrangement with in each case one or more heat absorption elements 1 guide their heat to a heat output element 3, in particular outside of a control cabinet.

The device for cooling a bus bar 6 is suited in particular to the closed, constricted spatial conditions, in which above all power electronic devices, for instance converters of comparatively high power, are provided in control cabinets.

The device for cooling a bus bar is likewise also suited to switching systems with particularly constricted spatial conditions, from which the heat is to be discharged. These can be low and medium voltage level switching systems.

The invention claimed is:

1. A device for cooling a bus bar, said device comprising:
   a heat absorption element configured to rest in form-fit manner on the bus bar;
   a heat output element configured to rest in a form-fit manner on a heat sink and aligned in parallel to the heat absorption element;
   compression springs guided by a guiding pin and arranged between the heat absorption element and the heat output element to apply an additional contact force; and
   a heat transportation system constructed from copper or designed as a heat pipe and materially connecting the heat absorption element and to the heat output element in a thermally conductive manner by welding or soldering.

2. The device of claim 1, further comprising a heat transfer media connecting the heat absorption element and the heat output element to the bus bar and the heat sink, respectively.

3. The device of claim 2, wherein the heat transfer media is a heat-conducting paste.

4. The device of claim 1, further comprising a thermally-conductive, electrically insulating layer via which the heat absorption element contacts the bus bar.

5. The device of claim 1, constructed for cooling the bus bar in a compact electrical switching system with bus bar arrangements.

6. The device of claim 5, wherein the electrical switching system includes a control cabinet of converters, a low voltage switching system, or a medium voltage switching system.

7. The device of claim 1, wherein the heat transportation system constructed from copper is flexible, retaining the thermally conductive connection between the heat absorption element and the heat output element also during movement between the heat absorption element and the heat output element.

* * * * *